United States Patent
Han et al.

(10) Patent No.: US 10,204,585 B2
(45) Date of Patent: Feb. 12, 2019

(54) SHIFT REGISTER UNIT, GATE DRIVING DEVICE, DISPLAY DEVICE AND DRIVING METHOD

(71) Applicant: BOE Technology Group Co., Ltd., Beijing (CN)

(72) Inventors: Seung Woo Han, Beijing (CN); Guangliang Shang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/542,365

(22) PCT Filed: Dec. 15, 2016

(86) PCT No.: PCT/CN2016/110087
§ 371 (c)(1),
(2) Date: Jul. 7, 2017

(87) PCT Pub. No.: WO2017/181700
PCT Pub. Date: Oct. 26, 2017

(65) Prior Publication Data
US 2018/0226039 A1    Aug. 9, 2018

(30) Foreign Application Priority Data
Apr. 18, 2016    (CN) .......................... 2016 1 0243000

(51) Int. Cl.
*G09G 3/36* (2006.01)
*G11C 19/28* (2006.01)

(52) U.S. Cl.
CPC ......... *G09G 3/3677* (2013.01); *G09G 3/3648* (2013.01); *G11C 19/28* (2013.01); *G09G 2310/0286* (2013.01)

(58) Field of Classification Search
CPC combination set(s) only.
See application file for complete search history.

(56) References Cited

U.S. PATENT DOCUMENTS

2010/0007598 A1    1/2010 Chan et al.
2012/0206434 A1    8/2012 Tsai et al.
(Continued)

FOREIGN PATENT DOCUMENTS

CN    1784711 A    6/2006
CN    101004498 A    7/2007
(Continued)

OTHER PUBLICATIONS

Mar. 24, 2017—International Search Report and Written Opinion Appn PCT/CN2016/110087 with Eng Tran.
(Continued)

*Primary Examiner* — Jennifer Mehmood
*Assistant Examiner* — Deeprose Subedi
(74) *Attorney, Agent, or Firm* — Banner & Witcoff, Ltd.

(57) ABSTRACT

A shift register unit, gate driving device, display device and driving method are provided. The shift register unit includes: an input circuit, configured to control a potential of a pull-up control node based on an input signal; a pull-down control circuit, configured to control a potential of a pull-down control node based on the input signal and the potential of the pull-up control node when first signal is at a first level; a pull-down circuit, configured to pull down the potential of the pull-up control node based on the potential of the pull-down control node; a pull-up circuit, configured to control an output signal output from a signal output terminal based on the potential of the pull-up control node and the clock signal; and a reset circuit, configured to reset the output signal based on the potential of the pull-down control node when second signal is at a second level.

20 Claims, 10 Drawing Sheets

(56) References Cited

U.S. PATENT DOCUMENTS

| 2013/0038586 | A1 | 2/2013 | Hsiao et al. | |
|---|---|---|---|---|
| 2014/0192039 | A1* | 7/2014 | Wang | G11C 19/28 345/213 |
| 2015/0371598 | A1* | 12/2015 | So | G09G 3/20 345/212 |

FOREIGN PATENT DOCUMENTS

| CN | 101122697 A | 2/2008 |
|---|---|---|
| CN | 204406959 U | 6/2015 |
| CN | 105096902 A | 11/2015 |
| CN | 105161066 A | 12/2015 |
| CN | 105206243 A | 12/2015 |
| CN | 105702222 A | 6/2016 |

OTHER PUBLICATIONS

Sep. 4, 2017—(CN) First Office Action 201610243000.3 with Eng Tran.

* cited by examiner

SHIFT REGISTER UNIT, GATE DRIVING DEVICE, DISPLAY DEVICE AND DRIVING METHOD

The application is a U.S. National Phase Entry of International Application No. PCT/CN2016/110087 filed on Dec. 15, 2016, designating the United States of America and claiming priority to Chinese Patent Application No. 201610243000.3 filed on Apr. 18, 2016. The present application claims priority to and the benefit of the above-identified applications and the above-identified applications are incorporated by reference herein in their entirety.

TECHNICAL FIELD

The present disclosure relates to a shift register unit, a gate driving device comprising the shift register unit, a display device comprising the gate driving device, and a driving method applied to the shift register unit.

BACKGROUND

At present, a liquid crystal display is applied widely. In a thin film transistor-liquid crystal display (TFT-LCD), gates of respective transistors of a pixel region are provided with gate driving signals through a gate driving device. In gate driver on array or gate on array (GOA) technique, a gate driving device is formed on an array substrate of a liquid crystal display through array technology, thereby the cost can be reduced and the process is simplified.

The gate driving device formed by adopting the GOA technique comprises multiple stages of shift register circuits, and the respective stages of shift register circuits are connected to different gate lines of transistors of the pixel region. In particular, the respective shift register circuits are connected to gate lines of transistors of a pixel region formed by rows, and controlling, such as turn on or turn off, is performed on transistors of a corresponding row through drive output signals output by the respective stages of shift register circuits. For example, when a certain shift register circuit outputs a drive output signal which is at a high level, a transistor of a row connected thereto is turned on. Then, the turned-on transistor of the row controls brightness according to a signal output by a data driving device.

Additionally, the respective stages of shift register circuits can be composed of a plurality of shift register units. The plurality of shift register units are connected to the gate lines of the transistors of the pixel region formed by rows, so as to perform controlling, such as turn on or turn off, on the transistors of this row. In particular, the respective shift register circuits are composed of two shift register units, which output gate driving signals to the connected gate lines of the transistors of the pixel region alternatively. In the case of performing the alternative driving as described above, when one shift register unit carries out an action and outputs a gate driving signal, the other shift register unit can stop carrying out the action.

As described above, in a liquid crystal display, when the shift register unit cannot operate normally, the liquid crystal display cannot display normally. Therefore, the shift register unit requires higher stability.

SUMMARY

There are provided in the present disclosure a shift register unit, a gate driving device comprising the shift register unit, a display device comprising the gate driving device, and a driving method applied to the shift register unit.

According to one aspect of the present disclosure, there is provided a shift register unit. The shift register unit comprises: an input circuit, whose input terminal receives an input signal, configured to control a potential of a pull-up control node based on the input signal; a pull-down control circuit, connected to an input terminal of a first signal, an input terminal of the input signal, and the pull-up control node and configured to control a potential of a pull-down control node based on the input signal and the potential of the pull-up control node during a time that the first signal is at a first level; a pull-down circuit, connected to the pull-down control node and configured to pull down the potential of the pull-up control node based on the potential of the pull-down control node; a pull-up circuit, connected to the pull-up control node and an input terminal of a clock signal and configured to control an output signal output from a signal output terminal based on the potential of the pull-up control node and the clock signal; and a reset circuit, connected to an input terminal of a second signal and the pull-down control node and configured to reset the output signal based on the potential of the pull-down control node during a period that the second signal is at a second level.

Optionally, in a phase where the clock signal is active, the second signal is at the second level when the first signal is at the first level, and the first signal is at the first level when the second signal is at the second level.

Optionally, the pull-down circuit is further connected to the input terminal of the second signal, and pulls down the potential of the pull-up control node based on the potential of the pull-down control node during a period that the second signal is at the second level.

Optionally, the pull-down circuit comprises a first transistor, whose first electrode is connected to the pull-up control node, gate is connected to the pull-down control node, and second electrode is connected to the input terminal of the second signal.

Optionally, the pull-down control circuit is further connected to the input terminal of the second signal, and pulls down the potential of the pull-down control node during a period that the second signal is at the first level.

Optionally, the pull-down control circuit comprises: a second transistor, whose first electrode and gate are connected to the input terminal of the first signal; a third transistor, whose first electrode is connected to the input terminal of the first signal, gate is connected to a second electrode of the second transistor, and second electrode is connected to the pull-down control node; a fourth transistor, whose first electrode is connected to the second electrode of the second transistor, gate is connected to the pull-up control node, and second electrode is connected to the low level input terminal; a fifth transistor, whose first electrode is connected to the pull-down control node, gate is connected to the pull-up control node, and second electrode is connected to the low level input terminal; and a sixth transistor, whose first electrode is connected to the pull-down control node, gate is connected to the input terminal of the input signal, and second electrode is connected to the low level input terminal.

Optionally, the pull-down control circuits comprises: a seventh transistor, whose first electrode is connected to the pull-down control node, gate is connected to the input terminal of the second signal, and second electrode is connected to the low level input terminal.

Optionally, the reset circuit comprises: an eighth transistor, whose first electrode is connected to the signal output terminal, gate is connected to the pull-down control node, and second electrode is connected to the input terminal of the second signal.

According to a second aspect of the present disclosure, there is provided a gate driving circuit. The gate driving device comprises N stages of shift register circuits which drive N rows of pixel arrays respectively, where N is an integer greater than 1; a same stage of shift register circuit comprises the first shift register unit as described above and the second shift register unit as described above, a first signal of the first shift register unit is the same as a second signal of the second shift register unit, and a second signal of the first shift register unit is the same as a first signal of the second shift register unit. In a phase where a clock signal is active, a clock signal input to a even-numbered stage of shift register circuit and a clock signal input to an even-numbered stage of shift register circuit become a first level alternatively, an input terminal of an input signal of a first shift register unit of a n-th stage of shift register circuit is connected to a signal output terminal of a first shift register unit of a (n−1)-th stage of shift register circuit, and an input terminal of an input signal of a second shift register unit of the n-th stage of shift register circuit is connected to a signal output terminal of a second shift register unit of the (n−1)-th stage of shift register circuit, where 1<n<=N, input terminals of input signals of a first shift register unit and a second shift register unit of a first stage of shift register circuit are connected to an output terminal of a start signal.

According to a third aspect, there is provided a display device. The display device comprises: a display panel; the gate driving device as described above, configured to output a drive output signal to the display panel.

According to a fourth aspect of the present disclosure, there is provided a driving method applied to a shift register unit, the driving method comprising: controlling a potential of a pull-up control node based on an input signal; controlling an output signal output from a signal output terminal based on the potential of the pull-up control node and a clock signal; controlling a potential of a pull-down control node based on an input signal and the potential of the pull-up control node during a period that a first signal is at a first level; pulling down the potential of the pull-up control node based on the potential of the pull-down control node; and resetting the output signal based on the potential of the pull-down control node during a period that a second signal is at a second level.

DETAILED DESCRIPTION

Implementations of the present disclosure will be described below specifically by referring to figures. Descriptions are given below by referring to the figures, so as to help in understanding exemplary implementations of the present disclosure defined by the Claims as well as equivalents thereof. It comprises respective specific details helpful for understanding, but they are just taken as being illustrative. Therefore, those skilled in the art would recognize that various modifications and amendments can be made to the implementations describe herein without departing from the scope and the spirit of the present disclosure. Furthermore, in order to make the specification clearer and simpler, detailed description about functions and structures well known in the art will be omitted.

Sources and drains of transistors adopted in the implementations of the present disclosure are symmetrical, and names of the sources and drains of all the transistors can be exchanged with each other. In addition, the transistors can be divided into N type transistors or P type transistors according to characteristics of the transistors. In the following description, when an N type transistor is adopted, its first electrode may be a source, and its second electrode may be a drain. The transistors adopted in the implementations of the present disclosure may be N type transistors or may be P type transistors. In the following embodiments, descriptions are given by taking the transistors being the N type transistors as an example, that is, when a signal of a gate is at a high level, the transistor is turned on. It could be conceived that when a P type transistor is adopted, a level and timing sequence of a control signal needs to be adjusted correspondingly.

Figure 1:
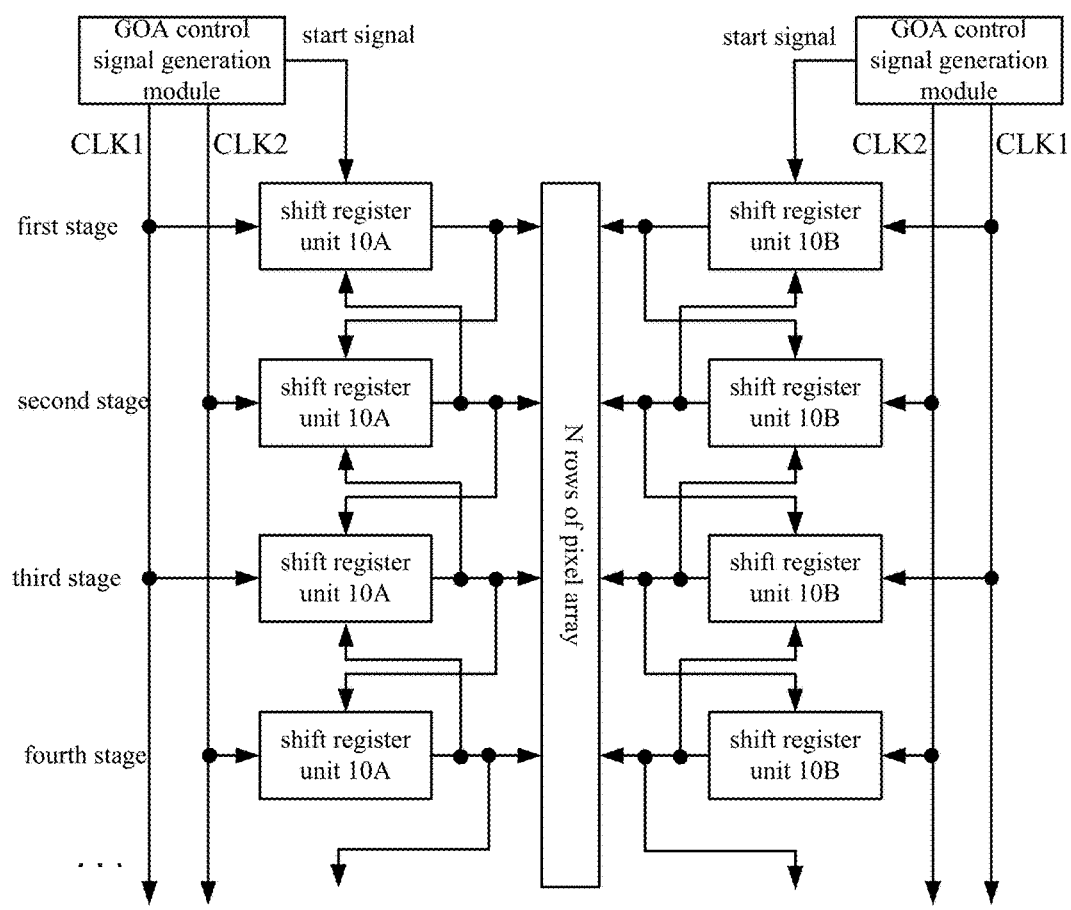
FIG. 1 is a schematic diagram representing a double scanning gate driving device applied in an implementation of the present disclosure.

First, a double scanning gate driving device applied in an implementation of the present disclosure is described by referring to FIG. 1. FIG. 1 is a schematic diagram representing the double scanning gate driving device applied in the implementation of the present disclosure.

The double scanning driving device as shown in FIG. 1 comprises a shift register unit 10A and a shift register unit 10B which drive respective rows of pixel arrays respectively. In particular, in the case of having N rows of pixel arrays, the double scanning gate driving device comprises N stages of shift register unit 10A and shift register unit 10B. The respective stages of shift register units 10A and shift register units 10B provide a gate driving signal to a corresponding row of pixel arrays, where N is an integer greater than 1.

In addition, the double scanning gate driving device as shown in FIG. 1 can further comprise a GOA control signal generation circuit configured to generate a start input signal, a clock signal, etc. The respective shift register units provide a gate driving signal to a corresponding row of pixel array according to the control signal generated by the GOA control signal generation circuit.

As shown in FIG. 1, the same stage of shift register unit 10A and shift register unit 10B provide the gate driving signal to a same row of pixel array. In particular, the shift register unit 10A and the shift register unit 10B provide the gate driving signal to the pixel array. For example, in the case of providing the gate driving signal to the pixel array by the shift register unit 10A in a certain phase, in this phase, the shift register unit 10B does not output a gate driving signal. In addition, in the case of providing the gate driving signal to the pixel array by the shift register unit 10B in other certain phase, in this phase, the shift register unit 10A does not output a gate driving signal.

Figure 2:
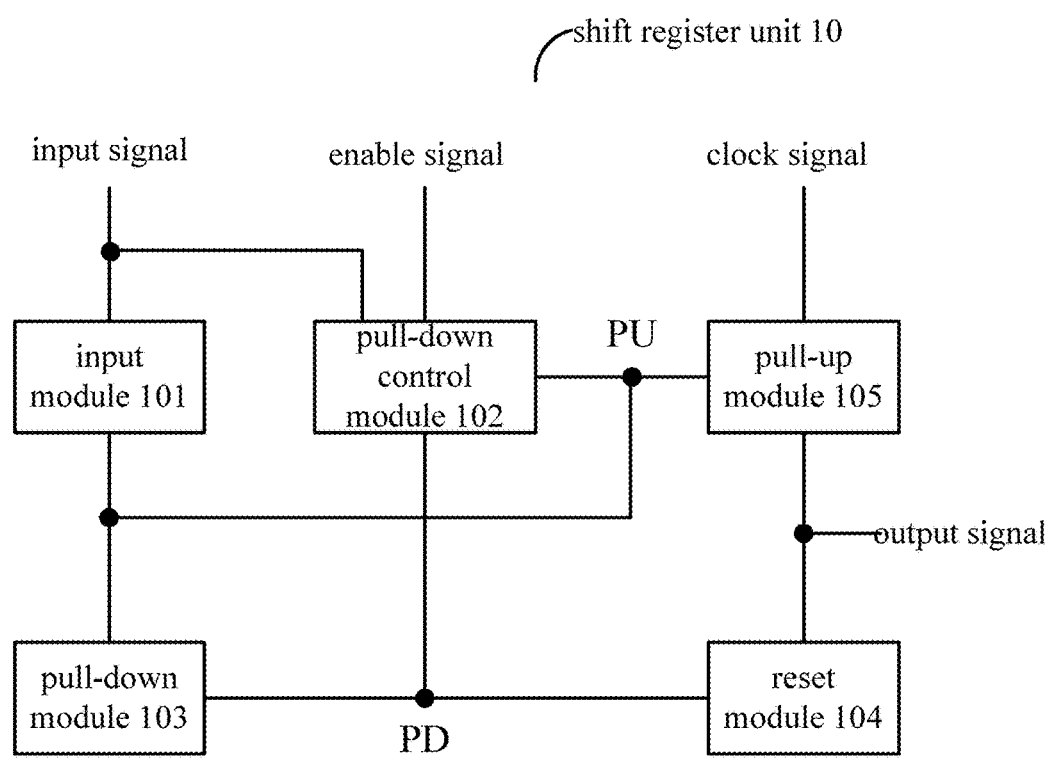
FIG. 2 is a functional block diagram illustrating a shift register unit used in the double scanning gate driving device as shown in FIG. 1.

In particular, FIG. 2 is a functional block diagram illustrating a shift register unit used in the double scanning gate driving device as shown in FIG. 1. In FIG. 2, the shift register unit 10A and the shift register unit 10B which provide the gate driving signal to the pixel array alternatively have a same structure. The structure of the shift register unit 10 will be described below by taking the structure of the shift register unit 10A as shown in FIG. 1 as an example.

As shown in FIG. 2, the shift register unit 10 comprises an input circuit 101, a pull-down control circuit 102, a pull-down circuit 103, a reset circuit 104, and a pull-up circuit 105.

An input terminal of the input circuit 101 receives an input signal, and the input circuit 101 controls a potential of a pull-up control node PU based on the input signal.

Returning to FIG. 1, in the double scanning gate device as shown in FIG. 1, in a first stage of shift register unit (i.e., the shift register unit 10A and the shift register unit 10B which provides the gate driving signal to a first row of pixel array), the input terminal of the input circuit 101 receives the start signal generated by the GOA control signal generation circuit. In addition, in a n-th stage of shift register unit (i.e., the shift register unit 10A and the shift register unit 10B which provide the gate driving signal to the n-th row of pixel array), the input terminal of the input circuit 101 receives a gate driving signal output by a (n−1)-th stage of shift register unit. Herein, N represents a number of rows of the pixel array, and also represents a number of stages of the shift register unit, n is an integer greater than 1 and smaller than or equal to N.

In the following description, in the case of providing the gate driving signal to a same row of pixel array by two or more shift register units, it will be recited as that a shift register circuit corresponding to the row of pixel array is composed of two or more shift register units. That is, the n-th stage of shift register circuit comprises a plurality of the n-th stage of shift register units (the shift register unit 10A and the shift register unit 10B in the example of FIG. 1).

The pull-down control circuit 102 is connected to the input terminal of the input signal and the pull-up control node PU, and controls the potential of the pull-down control node PU based on the input signal and the potential of the pull-up control node PU.

It should be noted that in a plurality of shift register units of a same stage, in the case of outputting the gate driving signal to the pixel array by a certain shift register unit 10, other shift register units of a plurality of shift register unit of a same stage do not output the gate driving signal to the pixel array.

For example, an enable signal generated by for example the GOA control signal generation circuit is received in respective shift register units 10. In the case of the received enable signal being at a specific level, the potential of the pull-down control node PD is controlled based on the input signal and the potential of the pull-up control node PU; otherwise, in the case of the received enable signal being not at a specific level, the potential of the pull-down control node PU is not controlled.

In particular, in FIG. 1, in the case that two shift register units 10A and 10B are included in a same stage of shift register circuits, two enable signals input to the shift register unit 10A and the shift register unit 10B are made at a specific level alternatively. For example, when the enable signal input to the shift register unit 10A is at the specific level (high level), the enable signal input to the shift register unit 10B is at the low level. For another example, when the enable signal input to the shift register unit 10A is not at the high level, the enable signal input to the shift register unit 10B is at the high level.

As shown in FIG. 2, the pull-down circuit 103 is connected to the pull-down control node PD and configured to pull up the potential of the pull-up control node based on the potential of the pull-down control node PD.

As described above, in the case of the enable signal input to the pull-down control circuit 102 being at the specific level, the potential of the pull-down control node PD is controlled. At this time, the pull-down circuit 103 is capable of pulling down the potential of the pull-up control node based on the controlled potential of the pull-down control node PD. Otherwise, in the case of the enable signal input to the pull-down control circuit 102 being not at the specific level, the potential of the pull-down control node PD is not controlled. At this time, the pull-down circuit 103 cannot pull down the potential of the pull-up control node based on the potential of the pull-down control node PD.

As shown in FIG. 2, the reset circuit 104 is connected to the pull-down control node PD and configured to reset the output signal output from the signal output terminal based on the potential of the pull-down control node PD.

As described above, in the case of the enable signal input to the pull-down control circuit 102 being at the specific level, the potential of the pull-down control node PD is controlled. At this time, the reset circuit 104 is capable of resetting the output signal (i.e., the gate driving signal output to the pixel array) based on the controlled potential of the pull-down control node PD. Otherwise, in the case of the enable signal input to the pull-down control circuit 102 being not at the specific level, the potential of the pull-down control node PD is not controlled. At this time, the reset circuit 104 cannot reset the output signal based on the potential of the pull-down control node PD.

As shown in FIG. 2, the pull-up circuit 105 is connected to the pull-up control node PU and the input terminal of the clock signal, and controls the output signal (i.e., the gate driving signal output to the pixel array) output from the signal output terminal based on the potential of the pull-up control node PU and the clock signal.

Returning to FIG. 1, in the double scanning gate driving device as shown in FIG. 1, a clock signal input to the odd-numbered stages of shift register units (10A, 10B) is a first clock signal CLK1, and a clock signal input to the even-numbered stages of shift register units (10A, 10B) is a second clock signal CLK2. Optionally, the first clock signal CLK1 and the second clock signal CLK2 become the first level (for example, high level) alternatively. In addition, in the following description, in the case of describing about a certain stage of shift register circuit, both the first clock signal and the second clock signal are called as the clock signal.

Additionally, modes and specific waveforms of the clock signals input to respective stages of shift register units are not limited to the above examples, only if it is capable of outputting a gate driving signal for turning on a corresponding row to the N rows of pixel arrays sequentially by respective stages of shift register circuits.

Figure 3:
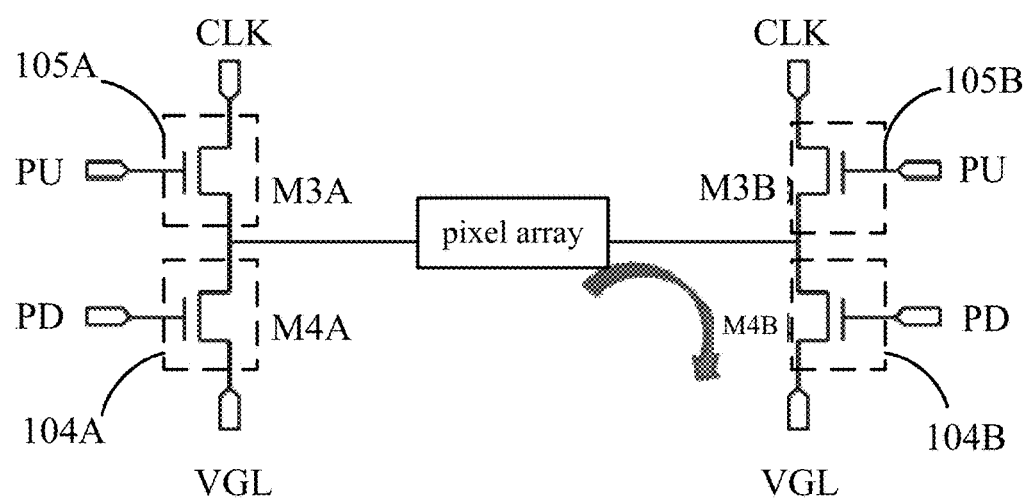
FIG. 3 is a structure diagram illustrating a pull-up circuit and a reset circuit in the double scanning gate driving device as shown in FIG. 1.

FIG. 3 is a structure schematic diagram illustrating the pull-up circuit and the reset circuit in the double scanning gate driving device as shown in FIG. 1.

Herein, the pull-up circuit and the reset circuit as shown in FIG. 3 are the pull-up circuit and the reset circuit of the plurality of shift register units included in the respective stages of shift register circuits.

Exemplarily, a pull-up circuit 105A and a reset circuit 104A in FIG. 3 are included in the shift register unit 10A. A pull-up circuit 105B and a reset circuit 104B in FIG. 3 are included in the shift register unit 100B.

As shown in FIG. 3, the pull-up circuit 105A comprises a transistor M3A, and the reset circuit 104A comprises a transistor M4A. Also, the pull-up circuit 105B comprises a transistor M3B, and the reset circuit 104B comprises a transistor M4B.

In the implementation of the present disclosure, optionally, in the case of the enable signal input to the shift register unit 10A being at the specific level (for example, high level), the pull-up circuit 105A pulls up the gate driving signal based on the potential of the pull-up control node PU and the clock signal CLK. Additionally, in the case of the enable signal input to the shift register unit 10A being at the specific level (for example, high level), the reset circuit 104A pulls down the gate driving signal based on the pull-down control node PD.

As described above, in the case of the enable signal input to the shift register unit 10A being at the specific level (for example, high level), the enable signal input to the shift register unit 10B is not at the specific level. At this time, the pull-down control node PD in the shift register unit 10B is at the low level. Therefore, a gate-source voltage of the transistor M4B included in the reset circuit 104B is 0V, so that certain leakage current flows through the transistor M4B.

When the gate driving signal being at the high level is output from the shift register unit 10A, since certain leakage current flows through the M4B in the shift register unit 10B, such that the gate driving signal would deform. In particular, due to the leakage current flowing through the M4B, a voltage of the gate driving signal being at the high level and output from the shift register unit 10A would be reduced, which causes that the shift register unit 10A cannot operate stably in the pixel array.

Figure 4:
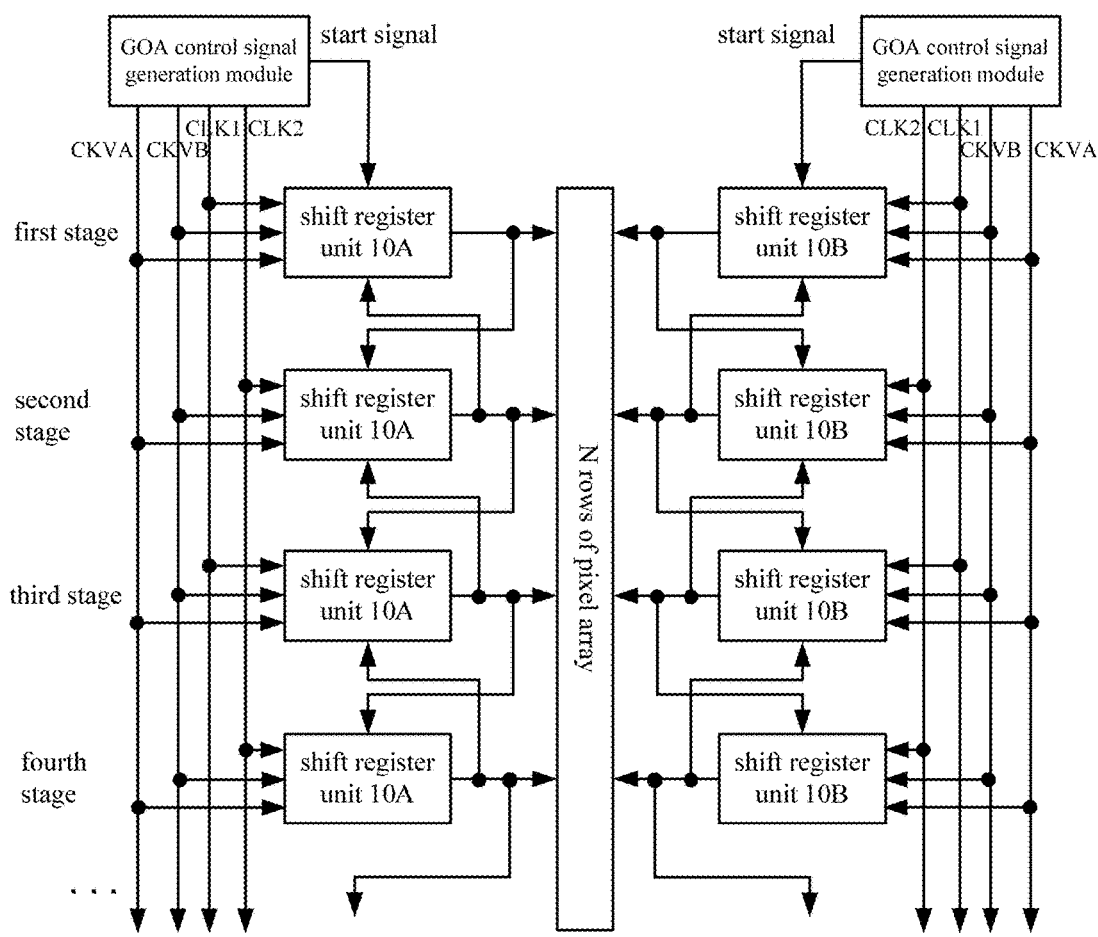
FIG. 4 is a functional block diagram representing a gate driving device of an implementation of the present disclosure.

A gate driving device of an implementation of the present disclosure will be described below by referring to FIG. 4. FIG. 4 is a functional block diagram representing the gate driving device of the implementation of the present disclosure.

The gate driving device as shown in FIG. 4 comprises N stages of shift register circuit which drive the respective rows of pixel arrays respectively. The respective stages of shift register circuit comprise the shift register unit 20A and the shift register unit 20B respectively. That is, the gate driving device comprises N shift register units 20A And N shift register units 20B. The same stages of shift register unit 20A and shift register unit 20B output the gate driving signal to the same row of pixel arrays.

Additionally, in the gate driving device as shown in FIG. 4, it further comprises a GOA control signal generation circuit configured to generate various control signals. The GOA control signal generation circuit generates for example a first clock signal CLK1, a second clock signal CLK2, an enable signal CKVA, an enable signal CKVB, and a start signal STV. It should be noted that in FIG. 4, the GOA control signal generation circuit does not have to be set, for example, the gate driving device can also receive the above various control signals from other external devices. In addition, in FIG. 4, for facilitating the illustration, two GOA control signal generation circuit are presented respectively. However, it could also be that only one GOA control signal generation circuit is arranged and control signals are provided to the shift register unit 20A and the shift register unit 20B respectively.

Figure 8:
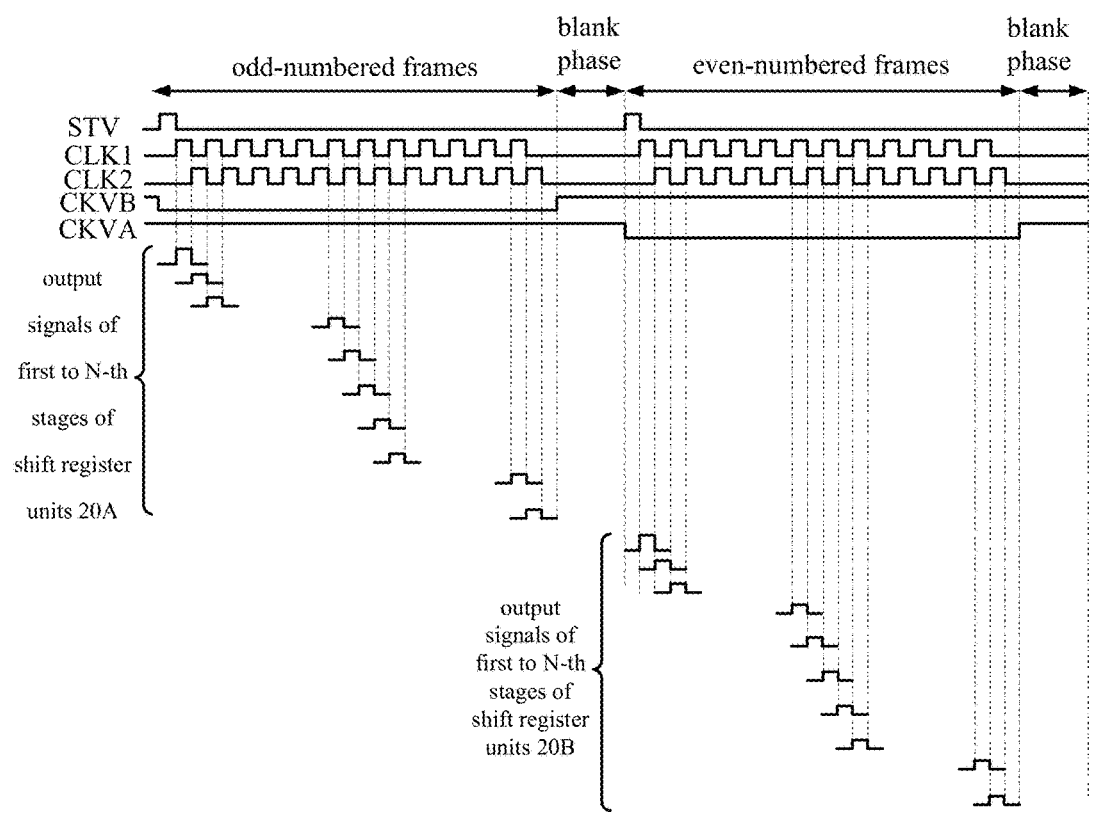
FIG. 8 is a waveform diagram of respective signals in the gate driving device as shown in FIG. 4.

Description is given below by combining with the waveform diagram of respective signals as shown in FIG. 8. FIG. 8 is a waveform diagram representing respective signals in the gate driving device as shown in FIG. 4.

In the gate driving device as shown in FIG. 4, the start signal STV is input to the first stage of shift register units 20A and 20B, so as to be capable of outputting a gate driving signal gained after the start signal STV has been shifted to the first row of pixel array. The gate driving signal output to the pixel array could also be recited below as the output signal output by the output terminal of the shift register unit 20.

Additionally, in the gate driving device as shown in FIG. 4, the n-th stage of shift register unit 20A receives an output signal output by a (n−1)-th stage of shift register unit 20A, so as to be capable of outputting an output signal, gained after the output signal of the (n−1)-th stage of shift register unit 20A has been shifted, to the n-th row of pixel array. Also, the n-th stage of shift register unit 20B receives an output signal output by the (n−1)-th stage of shift register unit 20B, so as to be capable of outputting an output signal, gained after the output signal of the (n−1)-th stage of shift register unit 20B has been shifted, to the n-th row of pixel array. Herein, n is an integer greater than 1 and smaller than or equal to N.

As shown in FIG. 8, the output signal of the first stage of shift register unit is shifted relative to the start signal STV. In addition, the output signal of the n-th stage of shift register unit is shifted relative to the output signal of the (n−1)-th stage of shift register unit.

In the gate driving device as shown in FIG. 4, for example, the first clock signal CLK1 and the second clock signal CLK2 are generated by the GOA control signal generation circuit. Herein, the first clock signal CLK1 is input to the shift register units 20A and 20B included in the odd-numbered stage of shift register circuit (for example, a first stage, a third stage, a fifth stage). In addition, the second clock signal CLK2 is input to the shift register units 20A and 20B included in the even-numbered stage of shift register circuits (for example, a second stage, a fourth stage, a sixth stage). In the implementation of the present disclosure, the first clock signal CLK1 and the second clock signal CLK2 become the first level alternatively. That is, when the first clock signal CLK1 becomes the high level, the second clock signal CLK2 becomes the low level; otherwise, when the first clock signal CLK1 becomes the low level, the second clock signal CLK2 becomes the high level. Furthermore, periods of the first clock signal CLK1 and the second clock signal CLK2 can be the same.

Exemplarily, as shown in FIG. 8, the clock signal is active in the even-numbered frames and the odd-numbered frames, and the clock signal is inactive in the blank phase. That is, in the blank phase, the clock signals including the first clock signal CLK1 and the second clock signal CLK2 maintain at the low level (they can also maintain at the high level). On the other hand, in the even-numbered frames and odd-numbered frames, the first clock signal CLK1 converts between the high level and the low level periodically, and the second clock signal CLK2 converts between the high level and the low level periodically. Herein, in the blank phase, the clock signal is inactive, so that the shift register unit 20A and the shift register unit 20B cannot output the gate driving signal to the pixel array in the blank phase.

Additionally, as shown in FIG. 8, in a phase where the clock signal is active (i.e., even-numbered frames and odd-numbered frames), when the first clock signal CLK1 becomes the high level, the second clock signal CLK2 becomes the low level; otherwise, when the first clock signal CLK1 becomes the low level, the second clock signal CLK2 becomes the high level.

In the gate driving device as shown in FIG. 4, the enable signal CKVA and the enable signal CKVB are received in the respective stages of shift register units 20A. Herein, in the case of the enable signal CKVA being at the first level, the shift register unit 20A performs an action. That is, in the case of the enable signal CKVA being at the first level, the shift register unit 20A outputs the gate driving signal gained after the input signal has been shifted according to the input signal (the start signal as described above or the output signal of the previous stage), the clock signal, etc. In addition, in the case of the enable signal CKVA being not at the specific level, the shift register unit 20A does not perform any action.

On the other hand, in the gate driving device as shown in FIG. 4, the enable signal CKV and the enable signal CKVB are also received in the respective stages of shift register unit 20B. Herein, when the enable signal CKVB is at the first level, the shift register unit 20B performs an action. That is, when the enable signal CKVB is at the first level, the shift register unit 20B outputs the gate driving signal gained after the input signal has been shifted according to the input signal (the start signal as described above or the output signal of the previous phase), the clock signal, etc. In addition, in the case of the enable signal CKVB being not at the first level, the shift register unit 20B does not perform action.

Additionally, in the implementation of the present disclosure, the enable signal CKVA and the enable signal CKVB can be at the first level alternatively. Thus, in the gate driving device as shown in FIG. 4, the shift register unit 20A and the shift register unit 20B included in the same stage of shift register circuit output the gate driving signal to the pixel array alternatively.

For example, as shown in FIG. 8, in the active phase of the clock signal, the enable signal CKVA and the enable signal CKVB are at the first level (for example, high level) alternatively. For example, in the odd-numbered frames, the enable signal CKVA is at the high level; relative to this, the enable signal CKVB is at the low level. In addition, in the even-numbered frames, the enable signal CKVB is at the high level; relative to this, the enable signal CKVA is at the low level.

As shown in FIG. 8, in odd-numbered frames where the enable signal CKVA is at the high level, the gate driving signal is output by the respective stages of shift register unit 20A; in even-numbered frames where the enable signal CKVB is at the high level, the gate driving signal is output by the respective stages of shift register unit 20B.

As described above, in the gate driving device as shown in FIG. 4, the gate driving signals are output alternatively by the shift register unit 20A and the shift register unit 20B through the enable signal CKVA and the enable signal CKVB.

Additionally, in the gate driving device as shown in FIG. 4, through the enable signal CKVB received in the respective stages of shift register unit 20A, the leakage current is prevented from being produced in the reset circuit as shown in FIG. 3 in the case of the gate driving signal being output by the respective stages of shift register unit 20B. Also, through the enable signal CKVA received in the respective stages of shift register unit 20B, the leakage current is prevented from being produced in the reset circuit as shown in FIG. 3 in the case of the gate driving signal being output by the respective stages of shift register units 20A.

Thus, in the gate driving device as shown in FIG. 4, the level of the gate driving signals output by the respective stages of shift register unit 20A or shift register unit 20B would not be reduced, so as to be capable of guaranteeing that the pixel array operates stably.

Figure 5:
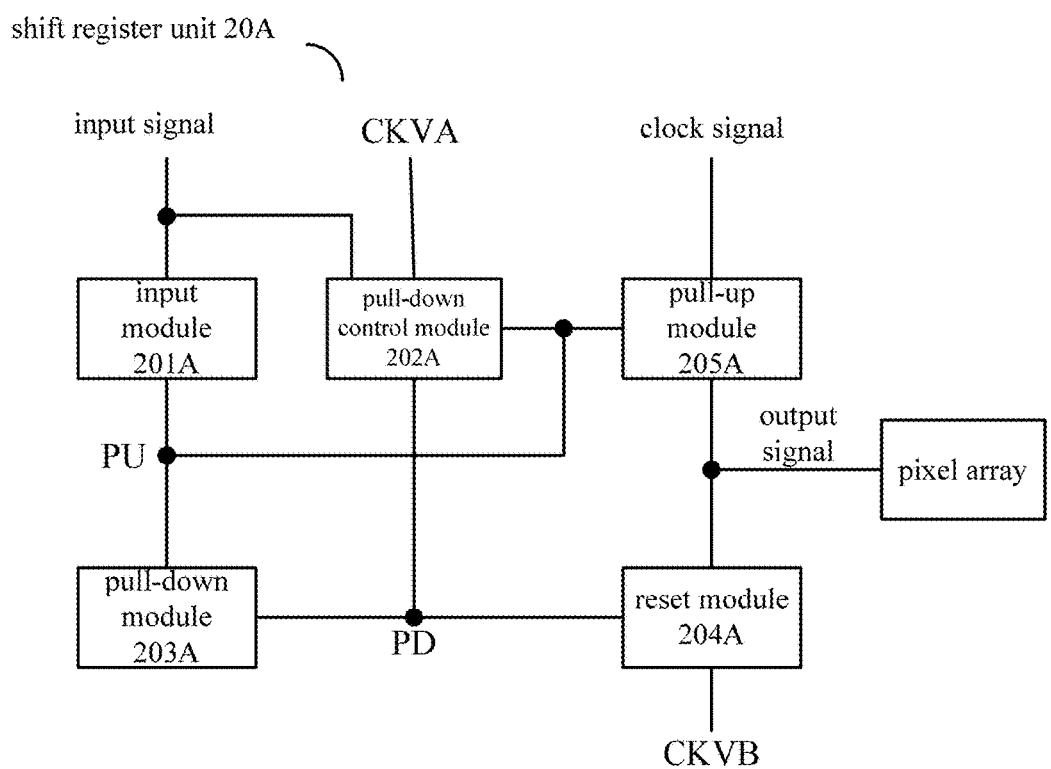
FIG. 5 is a functional block diagram representing a shift register unit of an implementation of the present disclosure.
Figure 6:
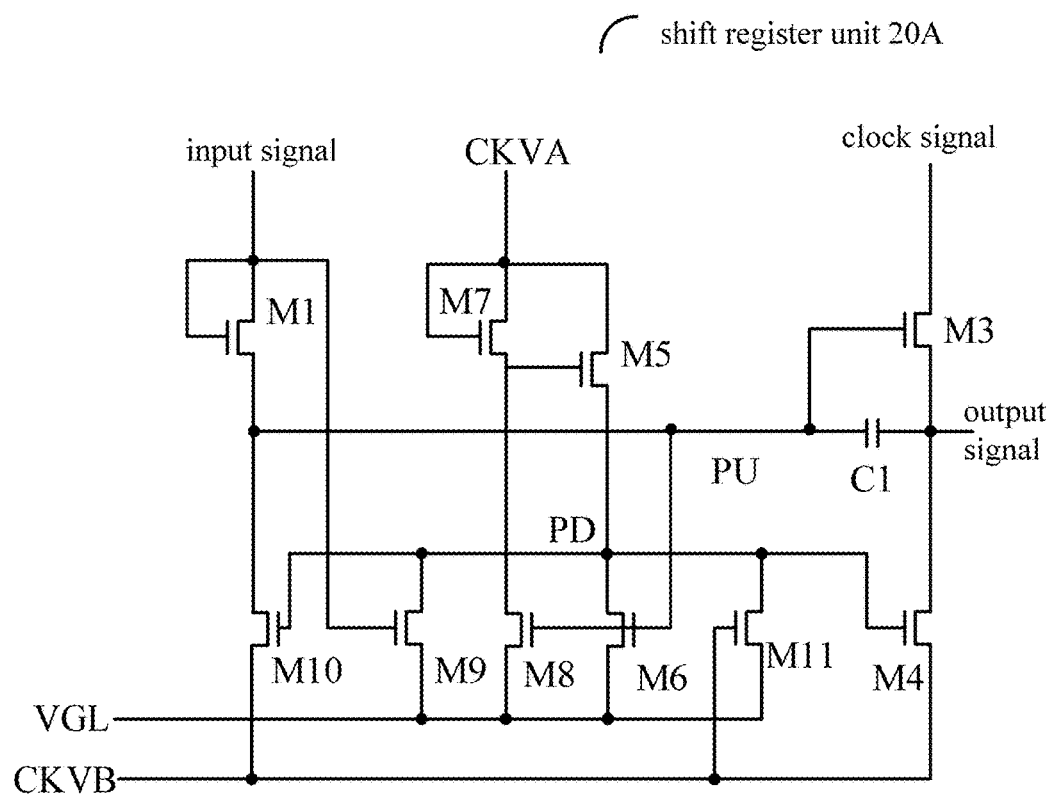
FIG. 6 is an illustrative diagram of a structure of a shift register unit of an implementation of the present disclosure.
Figure 7:
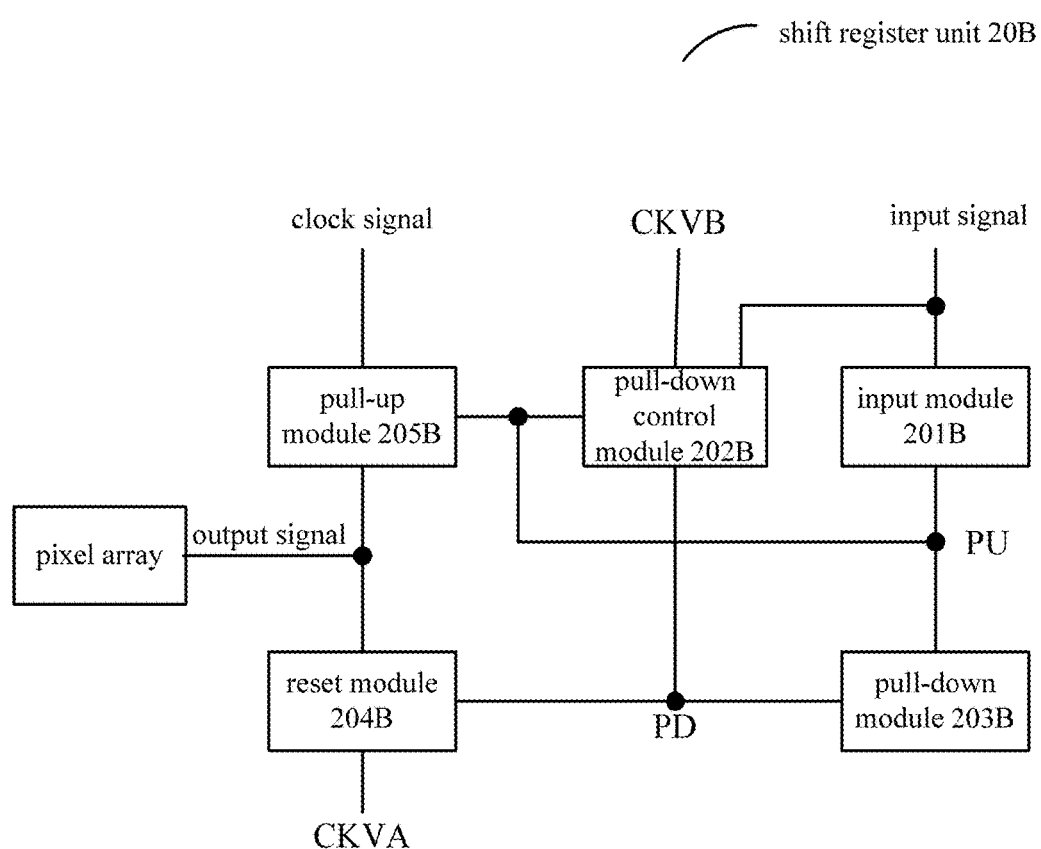
FIG. 7 is a functional block diagram representing a shift register unit of an implementation of the present disclosure.

The structure of the shift register unit provided in the embodiment of the present disclosure will be described below specifically by referring to FIGS. 5-7. FIGS. 5 and 7 are functional block diagrams representing the shift register unit of the implementation of the present disclosure. It may be noted that FIG. 5 represents the functional block diagram of the shift register unit 20A, and FIG. 7 represents the functional block diagram of the shift register unit 20B. FIG. 6 is an illustrative diagram representing the structure of the shift register unit of the implementation of the present disclosure.

First, the structure of the shift register unit 20A is described by referring to FIG. 5. As shown in FIG. 5, the shift register unit 20A comprises an input circuit 201A, a pull-down control circuit 202A, a pull-down circuit 203A, a reset circuit 204A and a pull-up circuit 205A.

An input terminal of the input circuit 201A receives an input signal, and the input circuit 201A controls the potential of the pull-up control node PU based on the input signal.

Returning to FIG. 4, in the double scanning gate driving device as shown in FIG. 4, in the first stage of shift register unit 20A, the input terminal of the input circuit 201A as shown in FIG. 5 receives the start signal STV. In addition, in the n-th stage of shift register unit 20A, the input terminal of the input circuit 201A as shown in FIG. 5 receives the gate driving signal output by the (n−1)-th stage of shift register unit. Herein, N represents a number of rows of the pixel array, and also represents a number of stages of the shift register unit, n is an integer greater than 1 and smaller than or equal to N.

Exemplarily, as shown in FIG. 6, the input circuit 201A can comprise a transistor M1. Herein, a first electrode and a gate of the transistor M1 are connected to the input terminal, and a second electrode of the transistor M1 is connected to the pull-up control node PU.

As shown in FIG. 5, the pull-down control circuit 202A is connected to an input terminal of the enable signal CKVA, the input terminal of the input signal, and the pull-up control node PU, and configured to control the potential of the pull-down control node PD based on the input signal and the potential of the pull-up control node PU during a period that the enable signal CKVA is at the first level.

In particular, in the shift register unit 20A, the pull-down control circuit 202A, for example, carries out controlling process on the potential of the pull-down control node PD during a period that the enable signal CKVA is at the high level.

Exemplarily, as shown in FIG. 6, the pull-down control circuit 202A can comprise a transistor M7 (corresponding to the second transistor in the technical solution), a transistor M5 (corresponding to the third transistor in the technical solution), a transistor M6 (corresponding to the fifth transistor in the technical solution), a transistor M8 (corresponding to the fourth transistor in the technical solution), and a transistor M9 (corresponding to the sixth transistor in the technical solution).

In FIG. 6, a first electrode and a gate of the transistor M7 are connected to the input terminal of the enable signal CKVA. A first electrode of the transistor M5 is connected to the input terminal of the enable signal CKVA, a gate of the transistor M5 is connected to a second electrode of the transistor M7, and a second electrode of the transistor M5 is connected to the pull-down control node PD.

Additionally, a first electrode of the transistor M8 is connected to the second electrode of the transistor M7, a gate of the transistor M8 is connected to the pull-up control node PU, and a second electrode thereof is connected to a low level input terminal VGL. A first electrode of the transistor M6 is connected to the pull-down control node PD, a gate of the transistor M6 is connected to the pull-up control node PU, and a second electrode of the transistor M6 is connected to the low level input terminal VGL. A first electrode of the transistor M9 is connected to the pull-down control node PD, a gate of the transistor M9 is connected to the input terminal of the input signal, and a second electrode of the transistor M9 is connected to the low level input terminal VGL.

When the enable signal CKVA is at the high level, it is capable of controlling the potential of the pull-down control node PD as, except for the situation that the input signal is at the high level and the potential of the pull-up control node PU is at the high level, being capable of maintaining the pull-down control node PD at the high level, so as to be capable of pulling down the potential of the pull-up control node PU and the potential of the output signal through the pull-down circuit 203A and the reset circuit 204A described below. In addition, when the enable signal CKVA is at the low level, the potential of the pull-down control node PD is changed to the low level.

Alternatively, the pull-down control circuit 202A is further connected to the input terminal of the enable signal CKVB, and pulls down the pull-down control node PD during a period that the enable signal CKVB is at the first level. For example, during a period that the enable signal CKVB is at the high level, the pull-down control circuit 202A pulls down the potential of the pull-down control node PD.

For example, as shown in FIG. 6, the pull-down control circuit 202A further comprises a transistor M11 (corresponding to the seventh transistor in the technical solution). Herein, a first electrode of the transistor M11 is connected to the pull-down control node PD, a gate of the transistor M11 is connected to the input terminal of the enable signal CKVB, and a second electrode of the transistor M11 is connected to the low level input terminal.

In the implementation of the present disclosure, by pulling down the pull-down control node PD during a period that the enable signal CKVB is at the first level, it is capable of stabilizing the potential of the pull-down control node at the low level quickly when the enable signal CKVA becomes the second level (for example, low level).

As shown in FIG. 5, the pull-down circuit 203A is connected to the pull-down control node PD, and configured to pull down the potential of the pull-up control node PU based on the potential of the pull-down control node PD.

As described above, except for the situation that the input signal is at the high level and the potential of the pull-up control node PU is at the high level, the pull-down control circuit 202A is capable of maintaining the pull-down control mode PD at the high level. For example, when the pull-down control node PD is at the high level, the pull-down circuit 203A pulls own the potential of the pull-up control node PU. On the other hand, in the case of the input signal being at the high level, the pull-down control node PD is at the low level, so that the pull-down circuit 203A would not pull down the potential of the pull-up control node PU.

In addition, in the implementation of the present disclosure, alternatively, the pull-down circuit 203A is further connected to the input terminal of the enable signal CKVB, and pulls down the potential of the pull-up control node PU based on the potential of the pull-down control node PD during a period that the enable signal CKVB is at the second level.

As described above, during a period that the clock signal is active, during a period that the enable signal CKVB is at the second level (low level), the enable signal CKVA is at the first level, so that the pull-down control circuit 202A is capable of operating normally.

For example, as shown in FIG. 6, the pull-down circuit 203A comprises a transistor M10 (corresponding to the first transistor in the technical solution). Herein, a first electrode of the transistor M10 is connected to the pull-up control node PU, a gate of the transistor M10 is connected to the pull-down control node PD, and a second electrode of the transistor M10 is connected to the input terminal of the enable signal CKVB.

Thus, when the enable signal CKVB is at the high level, as described above, the potential of the pull-down control node PD becomes the low level, so that a gate-drain voltage of the transistor M10 of the pull-down circuit 203A is smaller than 0, and no leakage current would flow through.

As shown in FIG. 5, the reset circuit 204A is connected to the input terminal of the enable signal CKVB and the pull-down control node PD, and configured to reset the output signal output from the signal output terminal based on the potential of the pull-down control node during a period that the enable signal CKVB is at the second level. In the shift register unit 20A, the enable signal CKVB is taken as the second signal.

Herein, in a phase where the clock signal is active, when the enable signal CKVA is at the high level, the enable signal CKVB sis at the low level. Thus, the reset circuit 204A is capable of, except the situation that the input signal is at the high level and the potential of the pull-up control node PU is at the high level, pulling down the gate driving signal output from the output terminal, when the pull-down control circuit 202 performs normal operation (maintaining the pull-up control node PD at the high level except that the input signal is at the high level and the potential of the pull-up control node PU is at the high level).

Exemplarily, as shown in FIG. 6, the reset circuit 204A can comprise a transistor M4 (corresponding to the eighth transistor in the technical solution). Herein, the first electrode of the transistor M4 is connected to the signal output terminal, a gate of the transistor M4 is connected to the pull-down control node PD, and a second electrode of the transistor M4 is connected to the input terminal of the enable signal CKVB.

On the other hand, during a period that the enable signal CKVB is at the high level (the enable signal CKVA is at the low level), the gate driving signal is output by the same stage of shift register unit 20B. At this time, through the effect of the enable signal CKVA, the potential of the pull-down control node PD is at the low level. Therefore, for example, a gate-source voltage of the transistor M4 included in the reset circuit 204A is smaller than 0, so as to prevent the leakage current from being produced in the transistor M4 as shown in FIG. 3. In this way, the gate driving signal output in the shift register unit 20B would not produce interference.

As shown in FIG. 5, the pull-up circuit 205A is connected to the pull-up control node PU and the input terminal of the clock signal, and controls the output signal (i.e., the gate driving signal output to the pixel array) output from the signal output terminal based on the potential of the pull-up control node PU and the clock signal.

It should be noted that, whether the first clock signal CLK1 or the second clock signal CLK2 is input to the input terminal of the clock signal depends on whether the shift register unit 20A including the pull-up circuit 205A is an even-numbered stage of shift register unit or an odd-numbered stage of shift register unit. In particular, the first clock signal CLK1 is input to the pull-up circuit 205A included in the odd-numbered stage of shift register unit 20A, and the second clock signal CLK2 is input to the pull-up circuit 205A included in the even-numbered stage of shift register unit 20A.

Exemplarily, as shown in FIG. 6, the pull-up circuit 205A comprises a transistor M3 and a capacitor C. Herein, a first electrode of the transistor M3 is connected to the input terminal of the clock signal, a gate of the transistor M3 is connected to the pull-up control node PU, and a second electrode of the transistor M3 is connected to the output terminal of the output signal. In addition, one terminal of the capacitor C1 is connected to the pull-up control node PU, and another terminal of the capacitor C1 is connected to the output terminal of the output signal.

Through the structure of the shift register unit 20A as shown in FIGS. 5-6, it is capable of outputting from the output terminal the output signal gained after the input signal has been shifted.

Additionally, the shift register unit 20A described above is not limited to form a same stage of shift register circuit together with the shift register unit 20B. For example, the shift register unit 20A can be used separately, only if the enable signal CKVA and the enable signal CKVB can be set appropriately. That is, the shift register unit 20A of the implementation of the present disclosure is not limited to be used in the double scanning gate driving device as shown in FIG. 4.

Additionally, as shown in FIG. 7, the shift register unit 20B comprises an input circuit 201B, a pull-down control circuit 202B, a pull-down circuit 203B, a reset circuit 204B and a pull-up circuit 205B. Herein, functions and structures of respective circuits included in the shift register unit 20B are basically the same as the basic functions and structures of the shift register unit 20A.

In the shift register unit 20B, the enable signal CKVB is received in a port corresponding to a port which receives the enable signal CKVA in the shift register unit 20A, and the enable signal CKVA is received in a port corresponding to a port which receives the enable signal CKVB in the shift register unit 20A. That is, in the shift register unit 20B, the enable signal CKVB is taken as the first signal, and the enable signal CKVA is taken as the second signal.

As shown in FIG. 7, the pull-down control circuit 202B is connected to the input terminal of the enable signal CKVB, the input terminal of the input signal, and the pull-up control node, and configured to control the potential of the pull-down control node based on the input signal and the potential of the pull-up control node during a period that the enable signal CKVB is at the first level.

Alternatively, the pull-down control circuit 202B is connected to the input terminal of the enable signal CKVA, and pulls down the potential of the pull-down control node during a period that the enable signal CKVA is at the first level.

The reset circuit 204B is connected to the input terminal of the enable signal CKVA and the pull-down control node PD, and configured to reset the output signal output from the signal output terminal based on the potential of the pull-down control node during a period that the enable signal CKVB is at the second level.

Additionally, alternatively, during a period that the pull-down circuit 203B is connected to the input terminal of the enable signal CKVA and the enable signal is at the second level, the potential of the pull-up control node is pulled down based on the potential of the pull-down control node.

During a period that no gate driving signal is output to the pixel array, the shift register unit according to the implementation of the present disclosure is capable of preventing the reset circuit of the shift register unit from producing the leakage current, so as to be capable of raising the stability of the shift register unit, and increase the service life time of the shift register unit. Furthermore, the pull-down circuit included in the shift register unit is capable of pulling down the potential of the pull-down control node quickly when the level of the enable signal is converted, so as to be capable of further preventing the reset circuit from producing the leakage current in time slots of level conversion of the enable signal.

Figure 9:
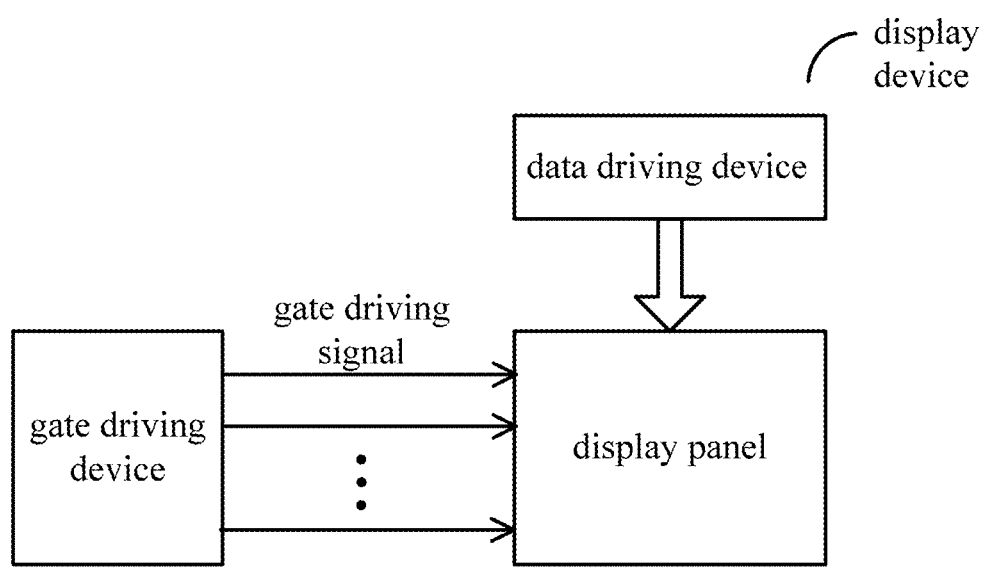
FIG. 9 is a functional block diagram representing a display device of an implementation of the present disclosure.

A display device of an implementation of the present disclosure will be described below by referring to FIG. 9. FIG. 9 is a functional block diagram representing the display device of the implementation of the present disclosure.

As shown in FIG. 9, the display device comprises a display panel and a gate driving device. In addition, in the display device as shown in FIG. 9, other devices can be disposed according to the requirements. For example, as shown in FIG. 9, the display device can further comprise the data driving device.

In particular, the display panel comprises N rows of pixel arrays. The pixel array included in the display panel takes the row as a unit, and is turned on according to the gate driving signal from the gate driving device. For example, in the case of the gate driving signal being at the high level, the corresponding row of pixel array is turned on.

The gate driving device included in the display device of FIG. 9 can adopt the structure as shown in FIG. 4. As described above, the gate driving device as shown in FIG. 4 comprises N stages of shift register circuits, and the respective stages of shift register circuits output the gate driving signal to the corresponding row of pixel array. Herein, the respective stages of shift register circuits are for example composed of the shift register unit 20A and the shift register unit 20B.

Additionally, in the case of a specific row of pixel array being turned on, brightness is controlled according to the signal from the data driving device. Herein, referring to the gate driving signal output by the respective stages of shift register unit as shown in FIG. 8, the N rows of pixel arrays are turned on sequentially, so as to be capable of displaying the output picture on the entire display panel according to the output signal of the data driving device.

The display device can be applied to any product or component having the display function such as a mobile phone, a tablet computer, a television set, a display, a notebook computer, a digital photo frame, a navigator, etc. The display device according to the implementation of the present disclosure is capable of preventing the reset circuit of the shift register unit from producing the leakage current during a period that no gate driving signal is output to the pixel array, so as to be capable of raising the stability of the shift register unit and increasing the service life time of the display device.

Figure 10:
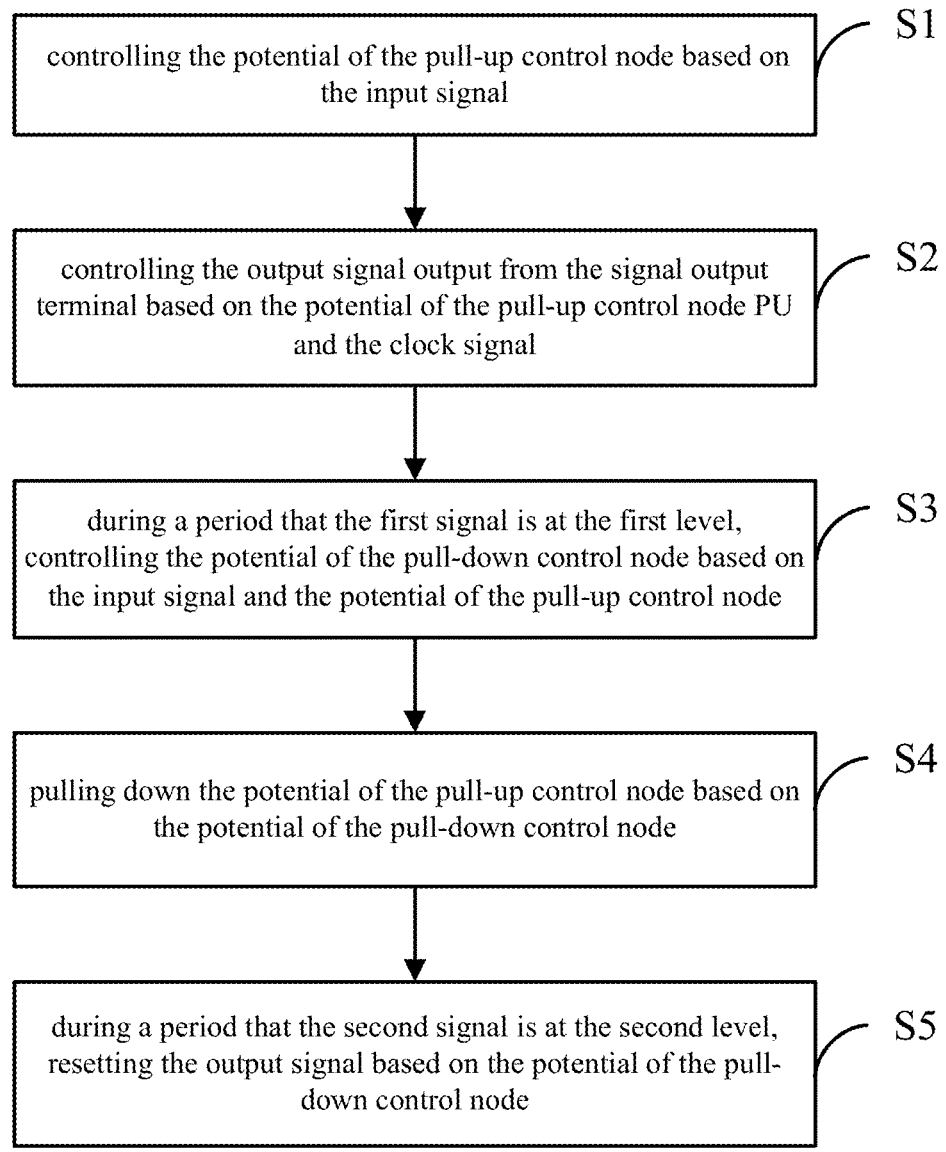
FIG. 10 is a flow diagram representing a driving method in an implementation of the present disclosure.

A controlling method applied to the shift register unit according to the implementation of the present disclosure will be described below by referring to FIG. 10. FIG. 10 is a flow diagram representing the controlling method of the implementation of the present disclosure.

In step S1, the potential of the pull-up control node is controlled based on the input signal.

In particular, in the case of being applied to the shift register unit 20A as shown in FIG. 5, the input terminal of the input circuit 201A receives the input signal, and the input circuit 201A controls the potential of the pull-up control node PU based on the input signal.

For example, as shown in FIG. 6, the input circuit 201A can comprise the transistor M1. Through the transistor M1, the input circuit 201A is capable of delivering the input signal to the pull-up control node PU.

In step S2, the output signal output from the signal output terminal is controlled based on the potential of the pull-up control node PU and the clock signal.

In particular, in the case of being applied to the shift register unit 20A as shown in FIG. 5, the pull-up circuit 205A is connected to the pull-up control node PU and the input terminal of the clock signal, and controls the output signal (i.e., the gate driving signal output to the pixel array) output from the signal output terminal based on the potential of the pull-up control node PU and the clock signal.

For example, as shown in FIG. 6, the pull-up circuit 205A can comprise the transistor M3 and the capacitor C1. Herein, the first electrode of the transistor M3 is connected to the input terminal of the clock signal, the gate of the transistor M3 is connected to the pull-up control node PU, and the second electrode of the transistor M3 is connected to the output terminal of the output signal. In addition, one terminal of the capacitor C1 is connected to the pull-up control node PU, and another terminal of the capacitor C1 is connected to the output terminal of the output signal.

In step S3, during a period that the first signal is at the first level, the potential of the pull-down control node is controlled based on the input signal and the potential of the pull-up control node.

In particular, in the case of being applied to the shift register unit 20A as shown in FIG. 5, the pull-down control circuit 202A is connected to the input terminal of the enable signal CKVA, the input terminal of the input signal, and the pull-up control node PU, and configured to control the potential of the pull-down control node PD based on the input signal and the potential of the pull-up control node PU during a period that the enable signal CKVA is at the first level. The enable signal CKVA is taken as the first signal in the shift register unit 20A.

When the enable signal CKVA is at the high level, it is capable of controlling the potential of the pull-down control node PD as, except for the situation that the input signal is at the high level and the potential of the pull-up control node PU is at the high level, being capable of maintaining the pull-down control node PD at the high level, so as to be capable of pulling down the potential of the pull-up control node PU and the potential of the output signal through the pull-down circuit 203A and the reset circuit 204A described below. In addition, when the enable signal CKVA is at the low level, the potential of the pull-down control node PD becomes the low level.

For example, as shown in FIG. 6, the pull-down control circuit 202A can comprise the transistor M7, the transistor M5, the transistor M6, the transistor M8, and the transistor M9.

In step S4, the potential of the pull-up control node is pulled down based on the potential of the pull-down control node.

In particular, in the case of being applied to the shift register unit 20A as shown in FIG. 5, the pull-down circuit 203A is connected to the pull-down control node PD, and configured to pull down the potential of the pull-up control node PU based on the potential of the pull-down control node PD. When the pull-down control node PD is at the high level, the pull-down circuit 203A pulls down the potential of the pull-up control node PU. On the other hand, when the input signal is at the high level, the pull-down control node PD is at the low level, so that the pull-down circuit 203A would not pull down the potential of the pull-up control node PU.

For example, as shown in FIG. 6, the pull-down circuit 203A can comprise the transistor M10. Herein, the first electrode of the transistor M10 is connected to the pull-up control node PU, the gate of the transistor M10 is connected to the pull-down control node PD, and the second electrode of the transistor M10 is connected to the input terminal of the enable signal CKVB.

In step S5, during a period that the second signal is at the second level, the output signal is reset based on the potential of the pull-down control node.

In particular, in the case of being applied to the shift register unit 20A as shown in FIG. 5, the reset circuit 204A is connected to the input terminal of the enable signal CKVB and the pull-down control node PD, and configured to reset the output signal output from the signal output terminal based on the potential of the pull-down control node during a period that the enable signal CKVB is at the second level. The enable signal CKVB is taken as the second signal in the shift register unit 20A.

Herein, in a phase where the clock signal is active, when the enable signal CKVA is at the high level, the enable signal CKVB is at the low level. Thus, the reset circuit 204A is capable of pulling down the gate driving signal output from the output terminal, except that the input signal is at the high level and the potential of the pull-up control node PU is at the high level, when the pull-down control circuit 202 perform normal operation (the pull-down control node PD is maintained at the high level except the situation that the input signal is at the high level and the potential of the pull-up control node PU is at the high level,).

For example, as shown in FIG. 6, the reset circuit 204A can comprise the transistor M4. Herein, the first electrode of the transistor M4 is connected to the signal output terminal, the gate of the transistor M4 is connected to the pull-down control signal PD, and the second electrode of the transistor M4 is connected to the input terminal of the enable signal CKVB.

On the other hand, during a period that the enable signal CKVB is at the high level (the enable signal CKVA is at the low level), the gate driving signal is output by a same stage of shift register unit 20B. At this time, through the effect of the enable signal CKVA, the potential of the pull-down control node PD is at the low level. Therefore, for example, the gate-source voltage of the transistor M4 included in the reset circuit 204 is smaller than 0, so as to be capable of preventing the leakage current from being produced in the transistor M4 as shown in FIG. 3. Thus, the gate driving signal output in the shift register unit 20B would not produce interference.

During a period that the gate driving signal is not output to the pixel array, the controlling method according to the implementation of the present disclosure is capable of presenting the reset circuit of the shift register unit from producing the leakage current, so as to be capable of raising the stability of the shift register unit and increasing the service life time of the shift register unit.

Respective implementations of the present disclosure are described in detail. However, those skilled in the art shall understand that various amendments, combination or sub-combinations can be made to these implementations without departing from the principle and scope of the present disclosure, and these amendments shall fall into the scope of claims of the present disclosure.

What is claimed is:

1. A shift register unit, comprising:
    an input circuit, whose input terminal receives an input signal, configured to control a potential of a pull-up control node based on the input signal;
    a pull-down control circuit, connected to an input terminal of a first signal, an input terminal of the input signal, and the pull-up control node, and configured to control a potential of a pull-down control node based on the input signal and the potential of the pull-up control node during a period that the first signal is at a first level;
    a pull-down circuit, connected to the pull-down control node, and configured to pull down the potential of the pull-up control node based on the potential of the pull-down control node;
    a pull-up circuit, connected to the pull-up control node and an input terminal of a clock signal, and configured to control an output signal output from a signal output terminal based on the potential of the pull-up control node and the clock signal; and
    a reset circuit, connected to an input terminal of a second signal and the pull-down control node, and configured to reset the output signal based on the potential of the pull-down control node during a period that the second signal is at a second level,
    wherein in a phase where the clock signal is active, the second signal is at the second level when the first signal is at the first level, and the first signal is at the first level when the second signal is at the second level.

2. The shift register unit according to claim 1, wherein the pull-down circuit is further connected to the input terminal of the second signal, and pulls down the potential of the pull-up control node based on the potential of the pull-down control node during a period that the second signal is at the second level.

3. The shift register unit according to claim 2, wherein the pull-down circuit comprises:
    a first transistor, whose first electrode is connected to the pull-up control node, gate is connected to the pull-down control node, and second electrode is connected to the input terminal of the second signal.

4. The shift register unit according to claim 1, wherein the pull-down control circuit is further connected to the input terminal of the second signal, and pulls down the potential of the pull-down control node during a period that the second signal is at the first level.

5. The shift register unit according to claim 1, wherein the pull-down control circuit comprises:
    a second transistor, whose first electrode and gate are connected to the input terminal of the first signal;
    a third transistor, whose first electrode is connected to the input terminal of the first signal, gate is connected to a second electrode of the second transistor, and second electrode is connected to the pull-down control node;
    a fourth transistor, whose first electrode is connected to the second electrode of the second transistor, gate is connected to the pull-up control node, and second electrode is connected to a low level input terminal;
    a fifth transistor, whose first electrode is connected to the pull-down control node, gate is connected to the pull-up control node, and second electrode is connected to the low level input terminal; and
    a sixth transistor, whose first electrode is connected to the pull-down control node, gate is connected to the input terminal of the input signal, and second electrode is connected to the low level input terminal.

6. The shift register unit according to claim 4, wherein the pull-down control circuit comprises:
    a seventh transistor, whose first electrode is connected to the pull-down control node, gate is connected to the input terminal of the second signal, and second electrode is connected to a low level input terminal.

7. The shift register unit according to claim 1, wherein the reset circuit comprises:
    an eighth transistor, whose first electrode is connected to the signal output terminal, gate is connected to the pull-down control node, and second electrode is connected to the input terminal of the second signal.

8. A gate driving device, wherein the gate driving device comprises N stages of shift register circuits which drive N rows of pixel arrays respectively, where N is an integer greater than 1,
    a same stage of shift register circuit comprises a first shift register unit and a second shift register unit, both having a same structure with the shift register unit according to claim 1,
    a first signal of the first shift register unit is the same as a second signal of the second shift register unit, and a second signal of the first shift register unit is the same as a first signal of the second shift register unit,
    in a phase where a clock signal is active, a clock signal input to an even-numbered stage of shift register circuit and a clock signal input to an odd-numbered stage of shift register circuit become a first level alternatively,
    an input terminal of an input signal of a first shift register unit of an n-th stage of shift register circuit is connected to a signal output terminal of a first shift register unit of an (n−1)-th stage of shift register circuit, and an input terminal of an input signal of a second shift register unit of the n-th stage of shift register circuit is connected to a signal output terminal of a second shift register unit of the (n−1)-th stage of shift register circuit, where 1<n<=N, and
    input terminals of input signals of a first shift register unit and a second shift register unit of a first stage of shift register circuit are connected to an output terminal of a start signal.

9. A display device, comprising:
    a display panel; and
    the gate driving device according to claim 8, configured to output a drive output signal to the display panel.

10. A driving method applied to a shift register unit, comprising:
    controlling a potential of a pull-up control node based on an input signal;

controlling an output signal output from a signal output terminal based on the potential of the pull-up control node and a clock signal;

controlling a potential of a pull-down control node based on an input signal and the potential of the pull-up control node during a period that a first signal is at a first level;

pulling down the potential of the pull-up control node based on the potential of the pull-down control node; and resetting the output signal based on the potential of the pull-down control node during a period that a second signal is at a second level, wherein in a phase where the clock signal is active, the second signal is at the second level when the first signal is at the first level, and the first signal is at the first level when the second signal is at the second level.

11. The gate driving device according to claim 8, wherein the pull-down circuit is further connected to the input terminal of the second signal, and pulls down the potential of the pull-up control node based on the potential of the pull-down control node during a period that the second signal is at the second level.

12. The gate driving device according to claim 11, wherein the pull-down circuit comprises:
a first transistor, whose first electrode is connected to the pull-up control node, gate is connected to the pull-down control node, and second electrode is connected to the input terminal of the second signal.

13. The gate driving device according to claim 8, wherein the pull-down control circuit is further connected to the input terminal of the second signal, and pulls down the potential of the pull-down control node during a period that the second signal is at the first level.

14. The gate driving device according to claim 8, wherein the pull-down control circuit comprises:
a second transistor, whose first electrode and gate are connected to the input terminal of the first signal;
a third transistor, whose first electrode is connected to the input terminal of the first signal, gate is connected to a second electrode of the second transistor, and second electrode is connected to the pull-down control node;
a fourth transistor, whose first electrode is connected to the second electrode of the second transistor, gate is connected to the pull-up control node, and second electrode is connected to a low level input terminal;
a fifth transistor, whose first electrode is connected to the pull-down control node, gate is connected to the pull-up control node, and second electrode is connected to the low level input terminal; and
a sixth transistor, whose first electrode is connected to the pull-down control node, gate is connected to the input terminal of the input signal, and second electrode is connected to the low level input terminal.

15. The gate driving device according to claim 13, wherein the pull-down control circuit comprises:
a seventh transistor, whose first electrode is connected to the pull-down control node, gate is connected to the input terminal of the second signal, and second electrode is connected to a low level input terminal.

16. The display device according to claim 9, wherein the pull-down circuit is further connected to the input terminal of the second signal, and pulls down the potential of the pull-up control node based on the potential of the pull-down control node during a period that the second signal is at the second level.

17. The display device according to claim 16, wherein the pull-down circuit comprises:
a first transistor, whose first electrode is connected to the pull-up control node, gate is connected to the pull-down control node, and second electrode is connected to the input terminal of the second signal.

18. The display device according to claim 9, wherein the pull-down control circuit is further connected to the input terminal of the second signal, and pulls down the potential of the pull-down control node during a period that the second signal is at the first level.

19. The display device according to claim 9, wherein the pull-down control circuit comprises:
a second transistor, whose first electrode and gate are connected to the input terminal of the first signal;
a third transistor, whose first electrode is connected to the input terminal of the first signal, gate is connected to a second electrode of the second transistor, and second electrode is connected to the pull-down control node;
a fourth transistor, whose first electrode is connected to the second electrode of the second transistor, gate is connected to the pull-up control node, and second electrode is connected to a low level input terminal;
a fifth transistor, whose first electrode is connected to the pull-down control node, gate is connected to the pull-up control node, and second electrode is connected to the low level input terminal; and
a sixth transistor, whose first electrode is connected to the pull-down control node, gate is connected to the input terminal of the input signal, and second electrode is connected to the low level input terminal.

20. A shift register unit, comprising:
an input circuit, whose input terminal receives an input signal, configured to control a potential of a pull-up control node based on the input signal;
a pull-down control circuit, connected to an input terminal of a first signal, an input terminal of the input signal, and the pull-up control node, and configured to control a potential of a pull-down control node based on the input signal and the potential of the pull-up control node during a period that the first signal is at a first level;
a pull-down circuit, connected to the pull-down control node, and configured to pull down the potential of the pull-up control node based on the potential of the pull-down control node;
a pull-up circuit, connected to the pull-up control node and an input terminal of a clock signal, and configured to control an output signal output from a signal output terminal based on the potential of the pull-up control node and the clock signal; and
a reset circuit, connected to an input terminal of a second signal and the pull-down control node, configured to transmit the second signal to the output signal terminal so as to reset the output signal based on the potential of the pull-down control node during a period that the second signal is at a second level.

* * * * *